US008587358B2

(12) United States Patent
Utsunomiya

(10) Patent No.: US 8,587,358 B2
(45) Date of Patent: Nov. 19, 2013

(54) SEMICONDUCTOR INTEGRATED CIRCUIT INCLUDING VARIABLE RESISTOR CIRCUIT

(75) Inventor: Fumiyasu Utsunomiya, Chiba (JP)

(73) Assignee: Seiko Instruments Inc., Chiba (JP)

( * ) Notice: Subject to any disclaimer, the term of this patent is extended or adjusted under 35 U.S.C. 154(b) by 76 days.

(21) Appl. No.: 13/155,028

(22) Filed: Jun. 7, 2011

(65) Prior Publication Data

US 2011/0304376 A1 Dec. 15, 2011

(30) Foreign Application Priority Data

Jun. 10, 2010 (JP) ................................ 2010-133266

(51) Int. Cl.
*H03L 5/00* (2006.01)

(52) U.S. Cl.
USPC ........................................ 327/308; 333/81 R

(58) Field of Classification Search
USPC ................................ 327/306, 308; 333/81 R
See application file for complete search history.

(56) References Cited

U.S. PATENT DOCUMENTS 5,703,588 A * 12/1997 Rivoir et al. .................. 341/159
6,504,417 B1 * 1/2003 Cecchi et al. ................. 327/308
6,728,940 B2 * 4/2004 Carelli et al. ................... 438/10
7,619,488 B2 * 11/2009 Takada et al. ................ 333/17.3
7,659,765 B2 * 2/2010 Ito ................................. 327/308
7,759,928 B2 * 7/2010 Ogiwara et al. ........... 324/750.3

FOREIGN PATENT DOCUMENTS

JP 10-335593 A 12/1998

* cited by examiner

*Primary Examiner* — Dinh T. Le
(74) *Attorney, Agent, or Firm* — Brinks Gilson & Lione

(57) ABSTRACT

Provided is a semiconductor integrated circuit including a variable resistor circuit of the small layout area, which is free from an error in resistance caused by ON-state resistances of switch elements for trimming, and is also free from power supply voltage dependence and temperature dependence. The semiconductor integrated circuit including a variable resistor circuit includes: a resistor circuit including a plurality of series-connected resistors; a selection circuit including a plurality of switch elements for selecting a connected number of the plurality of series-connected resistors; and a control circuit for controlling ON-state resistances of the plurality of switch elements. The control circuit controls the ON-state resistances of the plurality of switch elements so as to obtain a predetermined ratio to a resistance of the plurality of series-connected resistors of the resistor circuit.

3 Claims, 4 Drawing Sheets

SEMICONDUCTOR INTEGRATED CIRCUIT INCLUDING VARIABLE RESISTOR CIRCUIT

RELATED APPLICATIONS

This application claims priority under 35 U.S.C. §119 to Japanese Patent Application No. 2010-133266 filed on Jun. 10, 2010, the entire content of which is hereby incorporated by reference.

BACKGROUND OF THE INVENTION

1. Field of the Invention

The present invention relates to a semiconductor integrated circuit including a variable resistor circuit.

2. Description of the Related Art

FIG. 3 illustrates a semiconductor integrated circuit including a conventional variable resistor circuit. Referring to FIG. 3, a trimming circuit 351 includes PMOS transistors 310, 311, and 312, NPN transistors 313, 314, and 315, constant current sources 316, 317, and 318, control signal input pads 321, 322, and 323, and wirings D, E, and F. The PMOS transistors 310, 311, and 312 each have a source connected to a VDD terminal and a gate connected to a control terminal VG. The NPN transistor 313 has a base connected to the constant current source 316 and the control signal input pad 321, an emitter connected to a VSS terminal, and a collector connected to the wiring D and a drain of the PMOS transistor 310. The NPN transistor 314 has a base connected to the constant current source 317 and the control signal input pad 322, an emitter connected to the VSS terminal, and a collector connected to the wiring E and a drain of the PMOS transistor 311. The NPN transistor 315 has a base connected to the constant current source 318 and the control signal input pad 323, an emitter connected to the VSS terminal, and a collector connected to the wiring F and a drain of the PMOS transistor 312.

A constant voltage circuit 341 includes an amplifier 301, resistors 302 to 306, and NMOS transistors 307, 308, and 309. The resistors 302 to 306 together form an output voltage dividing circuit. The NMOS transistors 307, 308, and 309 have sources and drains which are connected in parallel to the resistors 303, 304, and 305, respectively. The source and the drain of the NMOS transistor 307 are connected across the resistor 303, and a gate thereof is connected to the wiring D. The source and the drain of the NMOS transistor 308 are connected across the resistor 304, and a gate thereof is connected to the wiring E. The source and the drain of the NMOS transistor 309 are connected across the resistor 305, and a gate thereof is connected to the wiring F. The amplifier 301 has a non-inverting input terminal connected to a Vref terminal. The resistor 302 has one terminal connected to an output of the amplifier 301 and a VR terminal, and another terminal connected to an inverting input terminal of the amplifier 301 and the resistor 303. The resistors 302 to 306 are connected in series.

The semiconductor integrated circuit including the conventional variable resistor circuit is a circuit capable of trimming an output voltage to be output from the output terminal VR by trimming a resistance of the variable resistor circuit. The resistors 303 to 305 are subjected to trimming. When the control signal input pads 321, 322, and 323 are open, respective collector voltages of the NPN transistors 313, 314, and 315 are Lo, and the NMOS transistors 307, 308, and 309 are OFF. In this state, the resistors 303 to 305 are not short-circuited but connected to other adjacent elements. When 0 V is applied to the control signal input pads 321, 322, and 323, the NPN transistors 313, 314, and 315 become an interrupted state. Accordingly, the collector voltages are changed to Hi, and the NMOS transistors 307, 308, and 309 are turned ON. In this state, the resistors 303 to 305 are short-circuited. This way, trimming can be performed (see, for example, Japanese Patent Application Laid-open No. Hei 10-335593 (FIG. 1)).

In the semiconductor integrated circuit including the conventional variable resistor circuit as configured above, there is an error in trimming amount depending on ON-state resistances of the NMOS transistors as switch elements. It is therefore difficult to trim the resistance with accuracy. Further, there is another problem that, even if the trimming is performed taking the ON-state resistances into account, the trimmed resistance has an error because of power supply voltage dependence or temperature dependence of the ON-state resistances. Still further, there is another problem that the layout area of the circuit is increased because it is necessary to increase the size of the NMOS transistors for reducing the ON-state resistances to reduce the influence of the ON-state resistances.

SUMMARY OF THE INVENTION

The present invention has been made in view of the above-mentioned problems, and it is therefore an object thereof to provide a semiconductor integrated circuit including a variable resistor circuit of the small layout area, which is capable of trimming a resistance with accuracy and is free from power supply voltage dependence and temperature dependence.

In order to solve the above-mentioned problems, according to the present invention, there is provided a semiconductor integrated circuit including a variable resistor circuit, including: a resistor circuit including a plurality of series-connected resistors; a selection circuit including a plurality of switch elements for selecting a connected number of the plurality of series-connected resistors; and a control circuit for controlling ON-state resistances of the plurality of switch elements, in which the control circuit controls the ON-state resistances of the plurality of switch elements so as to obtain a predetermined ratio to a resistance of the plurality of series-connected resistors of the resistor circuit.

Therefore, according to the semiconductor integrated circuit including the variable resistor circuit of the present invention, the ON-state resistances of the switch elements for varying the resistance can be controlled to eliminate an error in trimming amount caused by the ON-state resistances of the switch elements. Besides, the present invention can provide the effect of eliminating the power supply voltage dependence and the temperature dependence and the effect of reducing the layout area.

DETAILED DESCRIPTION OF THE PREFERRED EMBODIMENTS

Referring to the accompanying drawings, embodiments of the present invention are described below.

Figure 1:
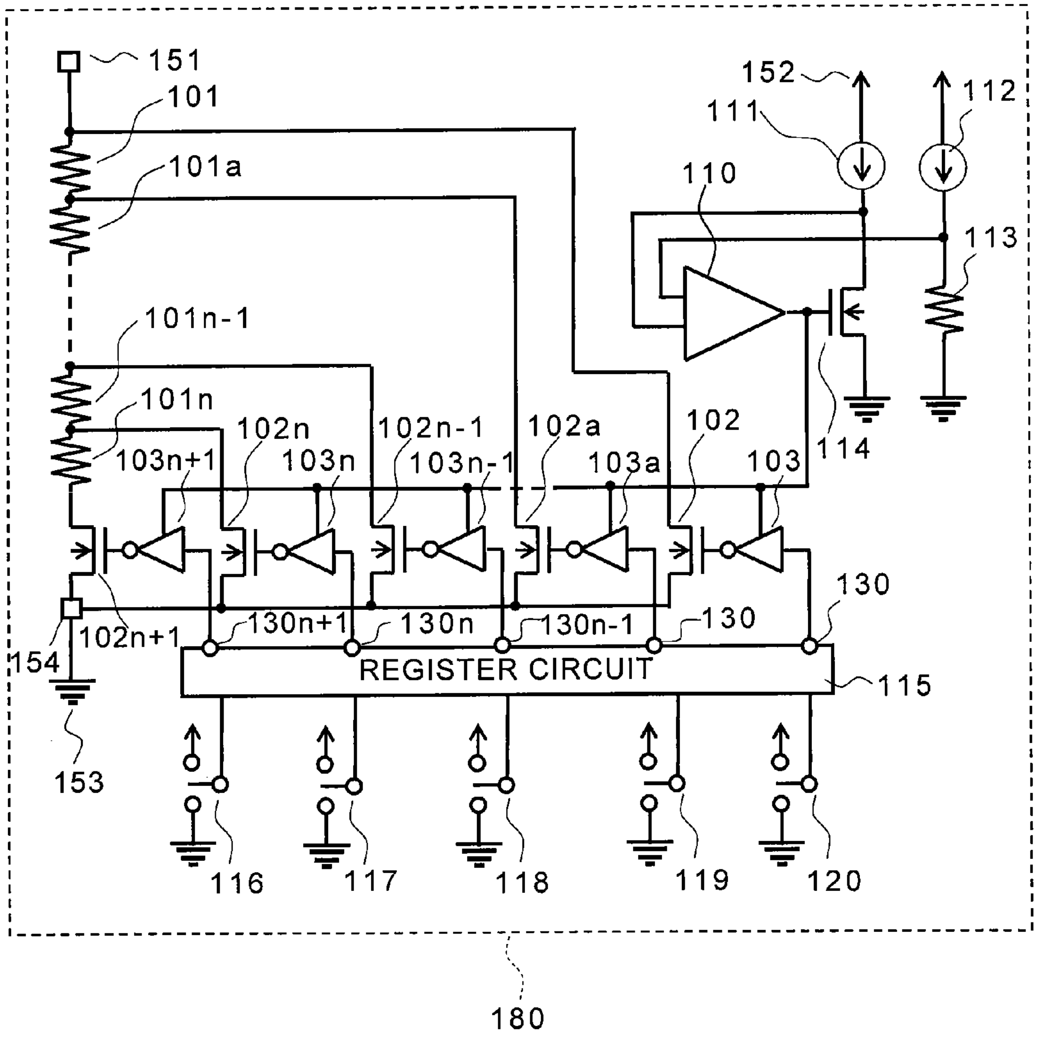
FIG. 1 is a circuit diagram illustrating a variable resistor circuit according to a first embodiment of the present invention.

FIG. 1 is a circuit diagram illustrating a variable resistor circuit 180 according to a first embodiment of the present invention. The variable resistor circuit 180 corresponds to the resistors 303 to 305 and the trimming circuit 351 of the related art. The variable resistor circuit 180 according to the first embodiment includes resistors 101 to 101*n* together forming a resistor circuit, a resistor 113 as a reference resistor, inverters 103 to 103*n*+1, NMOS transistors 102 to 102*n*+1 and 114, selector switches 116 to 120, an amplifier 110, constant current circuits 111 and 112, and a register circuit 115.

The amplifier 110 has a non-inverting input terminal connected to the constant current circuit 111 and a drain of the NMOS transistor 114, an inverting input terminal connected to the constant current circuit 112 and one terminal of the resistor 113, and an output connected to a gate of the NMOS transistor 114. The resistor 113 has another terminal connected to a VSS terminal 153. The NMOS transistor 114 has a source connected to the VSS terminal 153. The n resistors 101 to 101*n* are connected in series, and one end of the n series-connected resistors 101 to 101*n* is connected to an output terminal 151 and another end thereof is connected to a drain of the NMOS transistor 102*n*+1. The NMOS transistor 102*n*+1 has a gate connected to an output of the inverter 103*n*+1 and a source connected to an output terminal 154. The NMOS transistor 102*n* has a gate connected to an output of the inverter 103*n*, a drain connected to a connection point between one terminal of the resistor 101*n* and one terminal of the resistor 101*n*−1, and a source connected to the output terminal 154. The NMOS transistor 102*n*−1 has a gate connected to an output of the inverter 103*n*−1, a drain connected to another terminal of the resistor 101*n*−1, and a source connected to the output terminal 154. The NMOS transistor 102*a* has a gate connected to an output of the inverter 103*a*, a drain connected to a connection point between the resistors 101 and 101*a*, and a source connected to the output terminal 154. The NMOS transistor 102 has a gate connected to an output of the inverter 103, a drain connected to the output terminal 151, and a source connected to the output terminal 154. The register circuit 115 receives respective output signals of the selector switches 116 to 120. The register circuit 115 has an output terminal 130 connected to an input terminal of the inverter 103, an output terminal 130*a* connected to an input terminal of the inverter 103*a*, an output terminal 130*n*−1 connected to an input terminal of the inverter 103*n*−1, an output terminal 130*n* connected to an input terminal of the inverter 103*n*, and an output terminal 130*n*+1 connected to an input terminal of the inverter 103*n*+1. The inverters 103 to 103*n*+1 each have a power supply terminal connected to the output of the amplifier 110. The output terminal 154 is connected to the VSS terminal 153.

Next, an operation of the variable resistor circuit 180 according to the first embodiment as configured above is described.

Each of the selector switches 116 to 120 is switched in response to an external signal corresponding to a desired resistance, and outputs the switched signal to the register circuit 115. Based on the input signals, the register circuit 115 determines respective signals of the output terminals 130 to 130*n*+1.

When Hi is output from the output terminal 130 of the register circuit 115, the output of the inverter 103 is Lo, and the NMOS transistor 102 is turned OFF. When Lo is output from the output terminal 130 of the register circuit 115, the output of the inverter 103 is Hi, and the NMOS transistor 102 is turned ON. The other output terminals and NMOS transistors have the same relationships.

For example, when Lo is output from the output terminal 130 and Hi is output from all the other output terminals, only the NMOS transistor 102 is turned ON, and hence a resistance between the output terminals 151 and 154 is an ON-state resistance of the NMOS transistor 102.

As another example, when Lo is output from the output terminal 130*a* and Hi is output from all the other output terminals, only the NMOS transistor 102*a* is turned ON, and hence the resistance between the output terminals 151 and 154 is a series resistance of the resistance of the resistor 101 and an ON-state resistance of the NMOS transistor 102*a*.

As another example, when Lo is output from the output terminal 130*n* and Hi is output from all the other output terminals, only the NMOS transistor 102*n* is turned ON, and hence the resistance between the output terminals 151 and 154 is a series resistance of the resistances from the resistors 101 to 101*n*−1 and an ON-state resistance of the NMOS transistor 102*n*.

As another example, when Lo is output from the output terminal 130*n*+1 and Hi is output from all the other output terminals, only the NMOS transistor 102*n*+1 is turned ON, and hence the resistance between the output terminals 151 and 154 is a series resistance of the resistances from the resistors 101 to 101*n* and an ON-state resistance of the NMOS transistor 102*n*+1.

The constant current circuits 111 and 112 each supply a current I, which is substantially the same as a current I that flows between the output terminals 151 and 154 when a circuit or an external device is connected between the output terminals 151 and 154. The resistors 101 to 101*n* and the resistor 113 have the same resistance R. The NMOS transistors 102 to 102*n*+1 and the NMOS transistor 114 have the same size.

A voltage at the inverting input terminal of the amplifier 110 is a voltage I×R, which is determined by the current I of the constant current circuit 112 and the resistance R of the resistor 113. A voltage at the non-inverting input terminal of the amplifier 110 is also the voltage I×R because the NMOS transistor 114 is controlled by the output of the amplifier 110 so as to obtain the same voltage as the voltage at the inverting input terminal. In other words, the NMOS transistor 114 operates in the non-saturation region so that an ON-state resistance thereof is controlled to the same resistance R as that of the resistor 113.

Because the power supply terminals of the inverters 103 to 103*n*+1 are connected to the output of the amplifier 110, the inverters 103 to 103*n*+1 each output the voltage I×R as Hi. The NMOS transistors 102 to 102*n*+1 have the same size as that of the NMOS transistor 114, and hence when the inverters 103 to 103*n*+1 output Hi, the NMOS transistors 102 to 102*n*+1 operate in the non-saturation region so that the ON-state resistances thereof are controlled to the resistance R.

Therefore, for example, when the output terminal 130 of the register circuit 115 is Lo, the resistance between the output terminals 151 and 154 is the resistance R of the ON-state resistance of the NMOS transistor 102. As another example, when the output terminals 130 and 130*a* of the register circuit 115 are Lo, the resistance between the output terminals 151 and 154 is a series resistance 2R of the resistance of the resistor 101 and the ON-state resistance of the NMOS transistor 102*a*.

As described above, in the variable resistor circuit 180 according to this embodiment, the ON-state resistances of the NMOS transistors, which are trimming switches, are also used as the resistance R. Therefore, unlike the conventional variable resistor circuit, the resistance can be controlled with accuracy without causing an error by the ON-state resistances of the NMOS transistors. Further, the ON-state resistances of the NMOS transistors are controlled by the currents of the constant current circuits and the resistor, and hence power supply voltage dependence and temperature dependence can be reduced. Besides, the layout area can also be reduced because it is not necessary to reduce the ON-state resistances.

Figure 2:
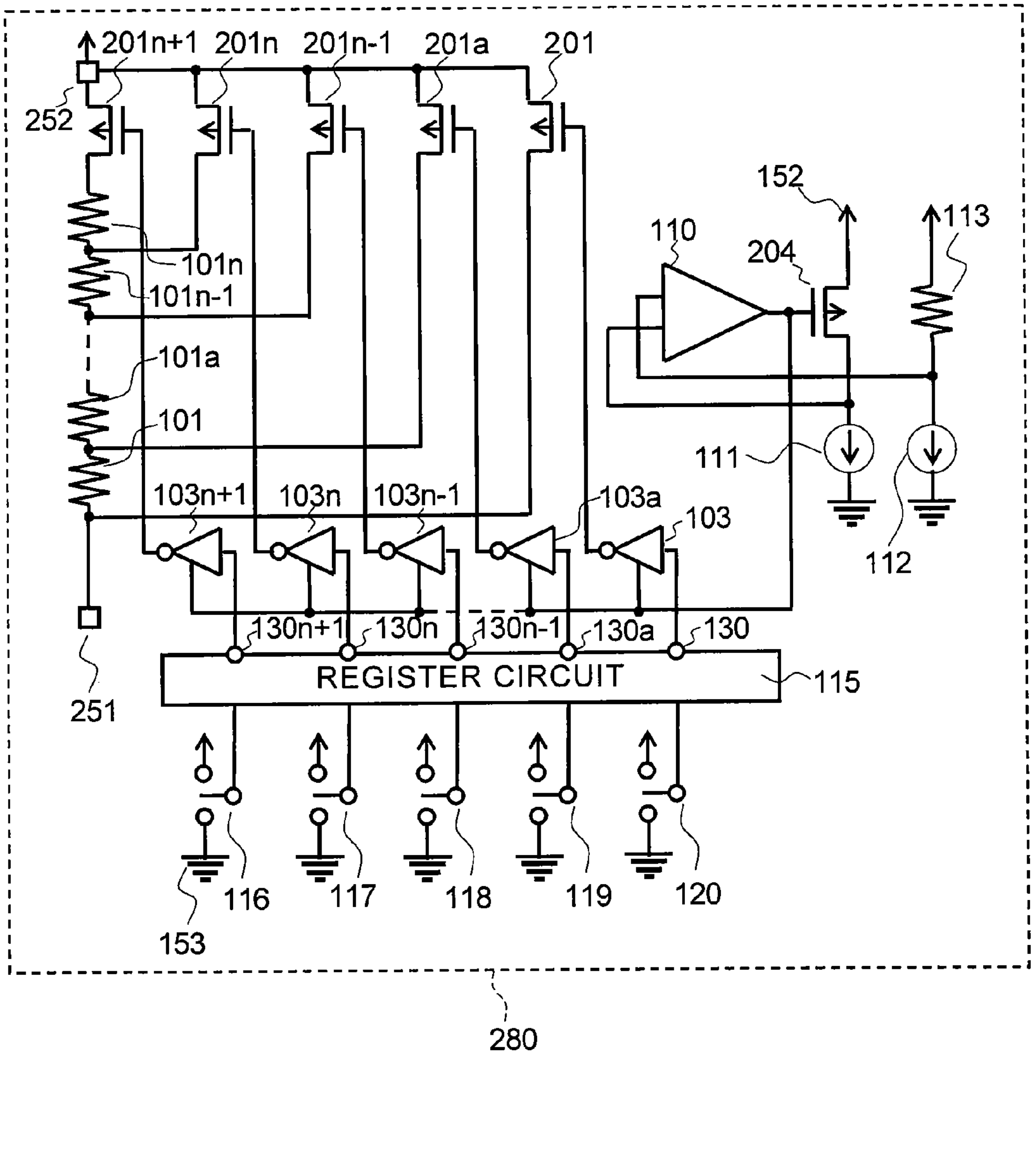
FIG. 2 is a circuit diagram illustrating a variable resistor circuit according to a second embodiment of the present invention.
Figure 3:
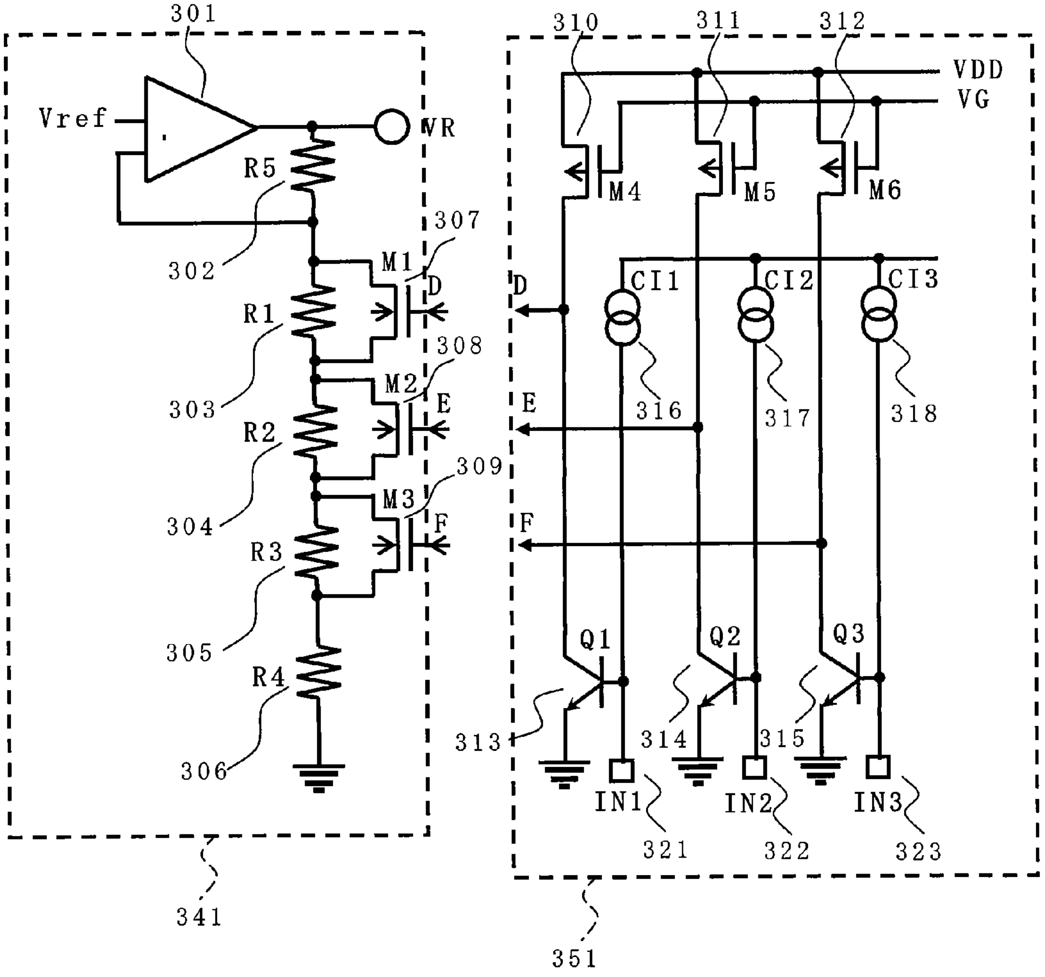
FIG. 3 PRIOR ART
FIG. 3 is a circuit diagram illustrating a semiconductor integrated circuit including a conventional variable resistor circuit.

FIG. 2 is a circuit diagram illustrating a variable resistor circuit 280 according to a second embodiment of the present invention. The variable resistor circuit 280 corresponds to the resistors 303 to 305 and the trimming circuit 351 of the related art. The variable resistor circuit 280 according to the second embodiment includes resistors 101 to 101*n* together forming a resistor circuit, a resistor 113 as a reference resistor, inverters 103 to 103*n*+1, PMOS transistors 201 to 201*n*+1 and 204, selector switches 116 to 120, an amplifier 110, constant current circuits 111 and 112, and a register circuit 115.

The amplifier 110 has a non-inverting input terminal connected to the constant current circuit 111 and a drain of the PMOS transistor 204, an inverting input terminal connected to the constant current circuit 112 and one terminal of the resistor 113, and an output connected to a gate of the PMOS transistor 204. The resistor 113 has another terminal connected to a VDD terminal 152. The PMOS transistor 204 has a source connected to the VDD terminal 152. The n resistors 101 to 101*n* are connected in series, and one end of the n series-connected resistors 101 to 101*n* is connected to an output terminal 251 and another end thereof is connected to a drain of the PMOS transistor 201*n*+1. The PMOS transistor 201*n*+1 has a gate connected to an output of the inverter 103*n*+1 and a source connected to an output terminal 252. The PMOS transistor 201*n* has a gate connected to an output of the inverter 103*n*, a drain connected to a connection point between one terminal of the resistor 101*n* and one terminal of the resistor 101*n*−1, and a source connected to the output terminal 252. The PMOS transistor 201 *n*−1 has a gate connected to an output of the inverter 103*n*−1, a drain connected to another terminal of the resistor 101 *n*−1, and a source connected to the output terminal 252. The PMOS transistor 201*a* has a gate connected to an output of the inverter 103*a*, a drain connected to a connection point between the resistors 101 and 101*a*, and a source connected to the output terminal 252. The PMOS transistor 201 has a gate connected to an output of the inverter 103, a drain connected to the output terminal 251, and a source connected to the output terminal 252. The register circuit 115 receives respective output signals of the selector switches 116 to 120. The register circuit 115 has an output terminal 130 connected to an input terminal of the inverter 103, an output terminal 130*a* connected to an input terminal of the inverter 103*a*, an output terminal 130*n*−1 connected to an input terminal of the inverter 103*n*−1, an output terminal 130*n* connected to an input terminal of the inverter 103*n*, and an output terminal 130*n*+1 connected to an input terminal of the inverter 103*n*+1. The inverters 103 to 103*n*+1 each have a VSS terminal connected to the output of the amplifier 110. The output terminal 252 is connected to the VDD terminal 152. In other words, the variable resistor circuit 280 according to the second embodiment operates with reference to the VDD terminal 152.

Next, an operation of the variable resistor circuit 280 according to the second embodiment as configured above is described.

The selector switches 116 to 120 are each switched in response to an external signal corresponding to a desired resistance, and outputs the switched signal to the register circuit 115. Based on the input signals, the register circuit 115 determines respective signals of the output terminals 130 to 130*n*+1.

When Hi is output from the output terminal 130 of the register circuit 115, the output of the inverter 103 is Lo, and the PMOS transistor 201 is turned ON. When Lo is output from the output terminal 130 of the register circuit 115, the output of the inverter 103 is Hi, and the PMOS transistor 201 is turned OFF. The other output terminals and PMOS transistors have the same relationships.

For example, when Hi is output from the output terminal 130 and Lo is output from all the other output terminals, only the PMOS transistor 201 is turned ON, and hence a resistance between the output terminals 252 and 251 is an ON-state resistance of the PMOS transistor 201.

As another example, when Hi is output from the output terminal 130*a* and Lo is output from all the other output terminals, only the PMOS transistor 201*a* is turned ON, and hence the resistance between the output terminals 252 and 251 is a series resistance of the resistance of the resistor 101 and an ON-state resistance of the PMOS transistor 201*a*.

As another example, when Hi is output from the output terminal 130*n* and Lo is output from all the other output terminals, only the PMOS transistor 201*n* is turned ON, and hence the resistance between the output terminals 252 and 251 is a series resistance of the resistances from the resistors 101 to 101*n*−1 and an ON-state resistance of the PMOS transistor 201*n*.

As another example, when Hi is output from the output terminal 130*n*+1 and Lo is output from all the other output terminals, only the PMOS transistor 201*n*+1 is turned ON, and hence the resistance between the output terminals 252 and 251 is a series resistance of the resistances from the resistors 101 to 101*n* and an ON-state resistance of the PMOS transistor 201*n*+1.

The constant current circuits 111 and 112 each supply a current I, which is substantially the same as a current I that flows between the output terminals 252 and 251 when a circuit or an external device is connected between the output terminals 252 and 251. The resistors 101 to 101*n* and the resistor 113 have the same resistance R. The PMOS transistors 201 to 201*n*+1 and the PMOS transistor 204 have the same size.

A voltage at the inverting input terminal of the amplifier 110 is a voltage $-I \times R$ with reference to the VDD terminal, which is determined by the current I of the constant current circuit 112 and the resistance R of the resistor 113. A voltage at the non-inverting input terminal of the amplifier 110 is also the voltage $-I \times R$ because the PMOS transistor 204 is controlled by the output of the amplifier 110 so as to obtain the same voltage as the voltage at the inverting input terminal. In other words, the PMOS transistor 204 operates in the non-saturation region so that an ON-state resistance thereof is controlled to the same resistance R as that of the resistor 113.

Because the VSS terminals of the inverters 103 to 103*n*+1 are connected to the output of the amplifier 110, the inverters 103 to 103*n*+1 each output the voltage $-I \times R$ as Lo. The PMOS transistors 201 to 201*n*+1 have the same size as that of the PMOS transistor 204, and hence when the inverters 103 to

103$n$+1 output Lo, the PMOS transistors 201 to 201$n$+1 operate in the non-saturation region so that the ON-state resistances thereof are controlled to the resistance R.

Therefore, for example, when the output terminal 130 of the register circuit 115 is Hi, the resistance between the output terminals 252 and 251 is the resistance R of the ON-state resistance of the PMOS transistor 201. As another example, when the output terminals 130 and 130$a$ of the register circuit 115 are Hi, the resistance between the output terminals 252 and 251 is a series resistance 2R of the resistance of the resistor 101 and the ON-state resistance of the PMOS transistor 201$a$.

As described above, in the variable resistor circuit 280 according to this embodiment, the ON-state resistances of the PMOS transistors, which are trimming switches, are also used as the resistance R. Therefore, unlike the conventional variable resistor circuit, the resistance can be controlled with accuracy without causing an error by the ON-state resistances of the PMOS transistors. Further, the ON-state resistances of the PMOS transistors are controlled by the currents of the constant current circuits and the resistor, and hence power supply voltage dependence and temperature dependence can be reduced. Besides, the layout area can also be reduced because it is not necessary to reduce the ON-state resistances.

Note that, in the description above, the ON-state resistances of the MOS transistors as the trimming switches are used as the same resistance as those of the resistors forming the resistor circuit. However, the present invention is not limited thereto, and the ON-state resistances may be a resistance twice or half the resistances of the resistors forming the resistor circuit.

Figure 4:
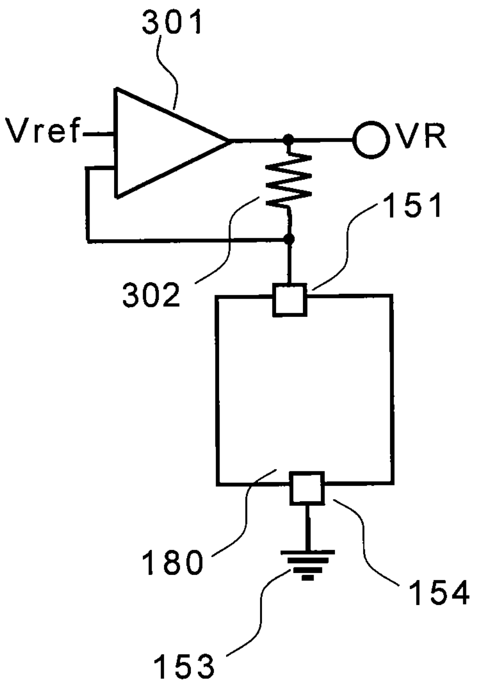
FIG. 4 is a circuit diagram illustrating a semiconductor integrated circuit including the variable resistor circuit according to the first embodiment of the present invention.

FIG. 4 is a circuit diagram illustrating a semiconductor integrated circuit including the variable resistor circuit 180 according to the first embodiment of the present invention. The semiconductor integrated circuit of FIG. 4 includes an amplifier 301, a resistor 302, and the variable resistor circuit 180, thereby constituting a constant voltage circuit.

The amplifier 301 has a non-inverting input terminal connected to a Vref terminal. The resistor 302 has one terminal connected to an output of the amplifier 301 and a VR terminal, and another terminal connected to an inverting input terminal of the amplifier 301 and the output terminal 151 of the variable resistor circuit 180. The output terminal 154 of the variable resistor circuit 180 is connected to the VSS terminal 153.

As described above, when the variable resistor circuit of the present invention is used as a constant voltage circuit, an output voltage with high trimming accuracy can be obtained, the power supply voltage dependence and the temperature dependence can be reduced, and the layout area can be reduced.

Figure 5:
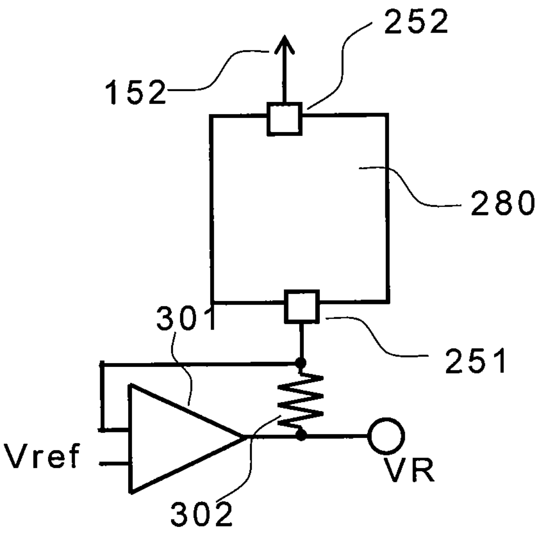
FIG. 5 is a circuit diagram illustrating a semiconductor integrated circuit including the variable resistor circuit according to the second embodiment of the present invention.

Further, even when the variable resistor circuit 280 is used to constitute a constant voltage circuit as illustrated in FIG. 5, an accurate output voltage can be obtained as well.

Note that, the constant voltage circuit has been described as an example of the semiconductor integrated circuit including the variable resistor circuit, but the same effects can be obtained as long as the variable resistor circuit according to the present invention is used for a semiconductor integrated circuit including a resistor circuit.

What is claimed is:

1. A semiconductor integrated circuit comprising a variable resistor circuit, comprising:

a resistor circuit comprising a plurality of series-connected resistors coupled together between first and second output terminals;

a selection circuit comprising a plurality of non-saturated MOS transistors connected to the resistor circuit between individual ones of the plurality of series-connected resistors, the selection circuit selecting a connected number of the plurality of series-connected resistors; and a control circuit for controlling ON-state resistances of the plurality of non-saturated MOS transistors, the control circuit including a reference resistor having a resistance value, wherein the reference resistor has the same characteristics as characteristics of the plurality of series-connected resistors of the resistor circuit, and wherein the control circuit selectively controls the ON-state resistances of the plurality of non-saturated MOS transistors to have the resistance value of the reference resistor and to obtain a predetermined resistance from the plurality of series-connected resistors of the resistor circuit at the first and second output terminals.

2. A semiconductor integrated circuit comprising a variable resistor circuit according to claim 1, wherein the control circuit further comprises a reference non-saturated MOS transistor of a same conductivity type as a conductivity type of the plurality of switch elements, wherein the control circuit controls a gate voltage of the reference non-saturated MOS transistor so as to obtain a desired ratio between an ON-state resistance of the reference non-saturated MOS transistor and the resistance of the reference resistor, and wherein the control circuit supplies the gate voltage of the reference non-saturated MOS transistor to gates of the plurality non-saturated MOS transistors.

3. A semiconductor integrated circuit comprising a variable resistor circuit according to claim 2, wherein the control circuit further comprises:

a first current source which is connected in series to the reference resistor;

a second current source which is connected in series to the reference non-saturated MOS transistor; and an amplifier which receives a voltage of the reference resistor and a voltage of the reference non-saturated MOS transistor, for controlling a gate of the reference non-saturated MOS transistor by an output voltage of the amplifier, and wherein the output voltage of the amplifier is supplied to the gates of the non-saturated MOS transistors of the plurality of switch elements.

* * * * *